(12) United States Patent
Matsumoto

(10) Patent No.: US 9,825,588 B2
(45) Date of Patent: Nov. 21, 2017

(54) OSCILLATOR, ELECTRONIC APPARATUS, AND MOVING OBJECT

(71) Applicant: Seiko Epson Corporation, Tokyo (JP)

(72) Inventor: Yoshiaki Matsumoto, Ina (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/370,245

(22) Filed: Dec. 6, 2016

(65) Prior Publication Data

US 2017/0085222 A1 Mar. 23, 2017

Related U.S. Application Data

(63) Continuation of application No. 14/848,772, filed on Sep. 9, 2015, now Pat. No. 9,548,699.

(30) Foreign Application Priority Data

Sep. 24, 2014 (JP) ................................ 2014-194171

(51) Int. Cl.
*H03B 5/36* (2006.01)
*H05K 1/02* (2006.01)
*H05K 3/40* (2006.01)

(52) U.S. Cl.
CPC .............. *H03B 5/368* (2013.01); *H03B 5/36* (2013.01); *H05K 1/0215* (2013.01); *H03B 2200/0026* (2013.01); *H05K 3/403* (2013.01); *H05K 2201/09181* (2013.01); *H05K 2201/10075* (2013.01)

(58) Field of Classification Search
CPC ........................................................ H03B 5/36
See application file for complete search history.

(56) References Cited

U.S. PATENT DOCUMENTS

| 7,791,423 | B2 | 9/2010 | Watanabe | |
|---|---|---|---|---|
| 2014/0159821 | A1* | 6/2014 | Yorita | ....................... H03L 7/06 331/16 |

FOREIGN PATENT DOCUMENTS

| JP | 2004-304253 A | 10/2004 |
|---|---|---|
| JP | 2005-006130 A | 1/2005 |
| JP | 2011-223470 A | 11/2011 |
| JP | 2012-151773 A | 8/2012 |

\* cited by examiner

*Primary Examiner* — Jeffrey Shin
(74) *Attorney, Agent, or Firm* — Oliff PLC

(57) ABSTRACT

An oscillator comprising a support substrate, at least one transducer mounted on a first surface of the support substrate, and an integrated circuit element mounted on a second surface of the support substrate. The integrated circuit element includes first and second frequency generating components integrated therein. The first frequency generating component generates a first output frequency, and the second frequency generating component generates a second output frequency that is higher than the first output frequency. The oscillator also includes a ground terminal to which the second frequency generating component is closer than the first frequency generating component.

16 Claims, 11 Drawing Sheets

OSCILLATOR, ELECTRONIC APPARATUS, AND MOVING OBJECT

CONTINUATION DATA

This application is a continuation of, and claims priority under 35 U.S.C. §120 on, application Ser. No. 14/848,772, filed Sep. 9, 2015, which claims priority to Japanese Patent Application No. 2014-194171, filed Sep. 24, 2014. Each such priority application is hereby expressly incorporated by reference herein in its entirety.

BACKGROUND

1. Technical Field

The present invention relates to an oscillator, an electronic apparatus, and a moving object.

2. Related Art

The reference frequencies used for backbone lines such as a synchronous optical network (SONET) and a synchronous digital hierarchy (SDH) are required to correspond to different frequencies from each other. For this purpose, equipment related to a transmission device used for backbone lines is provided with a plurality of oscillators capable of respectively oscillating frequency signals different from each other, and is configured to select a certain oscillators to output a desired frequency signal, by a selection signal or the like from the outside.

For example, JP-A-2005-6130 discloses a two-frequency switching-type high-frequency quartz crystal oscillator including a first quartz crystal oscillation unit that outputs a first frequency signal, a second quartz crystal oscillation unit that outputs a second frequency signal, a first switch for supplying power to any one of the first quartz crystal oscillation unit and the second quartz crystal oscillation unit, by a selection signal from the outside, and a second switch that selects any one of the outputs of the first quartz crystal oscillation unit and the second quartz crystal oscillation unit, by a selection signal from the outside.

In this two-frequency switching-type high-frequency quartz crystal oscillator, the frequencies of the frequency signals which are output from the first quartz crystal oscillation unit and the second quartz crystal oscillation unit are adjusted, by controlling the capacitance of the variable-capacitance diode included in the first quartz crystal oscillation unit and the capacitance of the variable-capacitance diode included in the second quartz crystal oscillation unit by a frequency control voltage.

Further, the first quartz crystal oscillation unit further includes a resistor, and the characteristics of the above-described variable-capacitance diode and the resistor are appropriately selected, depending on the output frequency that is obtained by the first quartz crystal oscillation unit.

Similarly, the second quartz crystal oscillation unit also further includes a resistor, and the characteristics of the above-described variable-capacitance diode and the resistor are appropriately selected, depending on the output frequency that is obtained by the second quartz crystal oscillation unit.

In the two-frequency switching-type high-frequency quartz crystal oscillator of such a configuration, for example, as JP-A-2012-151773, it is conceivable to arrange both the first and second quartz crystal oscillation units on a single substrate.

However, if attempting to place (mount) two quartz crystal oscillation units on a single substrate, as described above, while reducing the size of the oscillator itself, there is a need to place two quartz crystal oscillation units in a limited region on the substrate, such that there is a limit to the degree of freedom in the design of the oscillator.

Therefore, there is a problem in that in particular, the output frequency of a quartz crystal oscillation unit (oscillator circuit) for outputting an output frequency of a higher frequency is unstable, depending on positions where the two quartz crystal oscillation units (oscillator circuit) are placed.

SUMMARY

An advantage of some aspects of the invention is to provide an oscillator which is compact and in which the output frequencies are stable, and an electronic apparatus and a moving object, which are provided with the oscillator.

The invention can be implemented in numerous ways including the following forms.

An oscillator according to one aspect includes: a support substrate; at least one transducer mounted on a first surface of the support substrate; an integrated circuit element mounted on a second surface of the support substrate, the integrated circuit element including first and second frequency generating components integrated therein, the first frequency generating component generating a first output frequency and the second frequency generating component generating a second output frequency that is higher than the first output frequency; and a ground terminal. The second frequency generating component is closer than the first frequency generating component to the ground terminal.

With this configuration, since the second frequency generating component having a higher output frequency is placed closer to the ground terminal, the second output frequency is stable, resulting in stabilization of both the first and second output frequencies.

The first and second frequency generating components may comprise first and second oscillator circuits respectively.

With this arrangement, the first oscillator circuit may include a first multiplier circuit, the second oscillator circuit may include a second multiplier circuit, and the second multiplier circuit is placed closer to the ground terminal than the first multiplier circuit. With this configuration, it is possible to more reliably stabilize the second output frequency.

In another arrangement, there are first and second transducers. Moreover, the first frequency generating component is a first oscillator circuit that is electrically connected to the first transducer, and the second frequency generating component is a second oscillator circuit that is electrically connected to the second transducer.

In another arrangement, the ground terminal connects the integrated circuit element to the second surface of the support substrate.

In another arrangement, the one or more transducers at least partially overlap the integrated circuit in plan view.

In another arrangement, there is a terminal for outputting any one of the first output frequency and the second output frequency, and the first and second frequency generating components are placed at a position between the ground terminal and the output terminal on the substrate in plan view.

In another aspect, it is preferable that the second output frequency is 800 MHz or more.

When the second output frequency is such a high frequency, it is possible to more reliably stabilize the second output frequency.

An electronic apparatus according to another aspect includes the oscillator described above.

With this configuration, a highly reliable electronic apparatus is obtained.

A moving object according to another aspect includes the oscillator described above.

With this configuration, a highly reliable moving object is obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an oscillator, an electronic apparatus, and a moving object according to the invention will be described in detail based on embodiments illustrated in the accompanying drawings.

1. Oscillator Circuit

First, an oscillator circuit provided in an embodiment of an oscillator according to the invention will be described.

Figure 1:
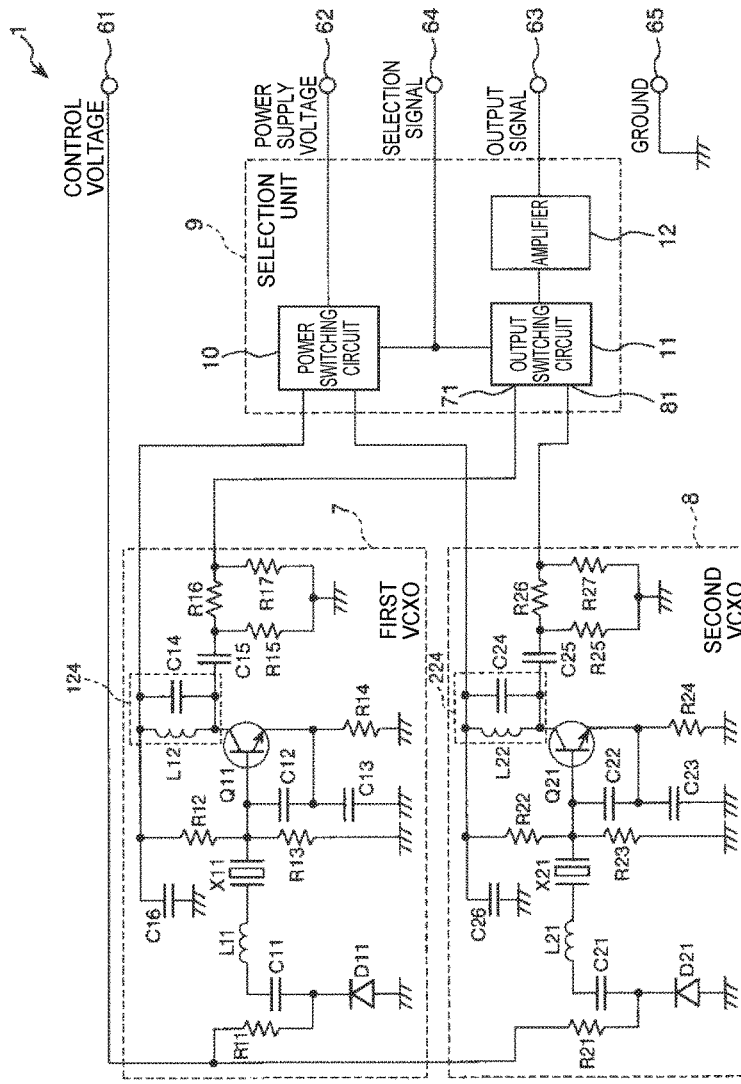
FIG. 1 is a block diagram illustrating an oscillator circuit provided in an embodiment of an oscillator according to the invention.

FIG. 1 is a block diagram illustrating an oscillator circuit provided in the embodiment of the oscillator according to the invention.

The oscillator circuit 1 illustrated in FIG. 1 is an example in which two voltage-controlled oscillator circuits (VCXO) are provided in a single substrate. The oscillator circuit 1 illustrated in FIG. 1 includes a first VCXO (a first oscillator circuit) 7 that outputs a desired first frequency signal (a first output frequency) by a control voltage applied from the outside, a second VCXO (a second oscillator circuit) 8 that outputs a desired second frequency signal (a second output frequency) by a control voltage applied from the outside, and a selection unit 9 that selects the output of the first VCXO 7 and the second VCXO 8.

In addition, the selection unit 9 includes a power switching circuit 10 for applying (supplying) a power supply voltage to any one of the first VCXO 7 and the second VCXO 8 by a selection signal applied from the outside, an output switching circuit 11 that selects the output of any one of the first VCXO 7 and the second VCXO 8 by a selection signal applied from the outside, and an amplifier 12 that amplifies the selected frequency signal to a predetermined level.

Further, the oscillator circuit 1 includes a control voltage terminal 61 for applying a control voltage to the first VCXO 7 and the second VCXO 8, a power supply terminal 62 that applies a power supply voltage to the power switching circuit 10, an oscillator output terminal (terminal for output) 63 that outputs a frequency signal amplified by the amplifier 12 to the outside, a selection signal terminal 64 for inputting a selection signal to the selection unit 9, and a ground terminal (terminal for output) 65 which is electrically grounded.

Hereinafter, the configuration of each part of the oscillator circuit 1 will be described in more detail. In addition, the configuration described below is an example of the configuration of the oscillator circuit included in the oscillator according to the invention, and the invention is not limited thereto.

The first VCXO 7 illustrated in FIG. 1 includes a so-called Colpitts oscillation circuit.

Specifically, the first VCXO 7 first includes a resistor R11 (a first resistor), a variable-capacitance diode D11 (a first variable-capacitance diode), a capacitor C11, an expansion coil L11, and a resonator X11 (oscillation unit). The control voltage is input to one end of the resistor R11 from the outside. Further, the other end of resistor R11 is connected to the cathode side of the variable-capacitance diode D11 and one end of the capacitor C11. Further, the other end of the capacitor C11 is connected to one end of the expansion coil L11, and the other end of the expansion coil L11 is connected to one end of the resonator X11.

In addition, the first VCXO 7 further includes a transistor Q11, a resistor R12, a resistor R13, a resistor R14, a capacitor C12, a capacitor C13, a capacitor C14, and a coil L12. The base of the transistor Q11, one end of the resistor R12, and one end of the resistor R13 are connected to the other end of the resonator X11. These resistor R12 and resistor R13 function as a base bias resistor. Then, the other end of the resistor R13 is grounded. Further, the capacitor C12 and the capacitor C13 which have some of the load capacitance are inserted in a state of being connected in series, to between the base of the transistor Q11 and the ground. Then, the connection point between the capacitor C12 and the capacitor C13 and the emitter of the transistor Q11 are connected, and the resistor R14 is inserted as an emitter resistor between the emitter of the transistor Q11 and the ground. Further, the coil L12 and the capacitor C14 are connected in parallel between the collector of the transistor Q11 and the power switching circuit 10. A tuning circuit (multiplier circuit) 124 that can be tuned to the harmonic frequency (higher-order wave) of a desired order number of the resonator X11 is configured, and a C tap is configured.

In addition, the first VCXO 7 further includes a capacitor C15, a capacitor C16, a resistor R15, a resistor R16, and a resistor R17. The coil L12 and the capacitor C14 on the power switching circuit 10 side are respectively grounded through the capacitor C16. Meanwhile, one end of the capacitor C15 is connected to the collector side of the coil L12 and capacitor C14. The other end of the capacitor C15 is connected to the output switching circuit 11 through an attenuator constituted by the resistor R15, the resistor R16, and the resistor R17. In other words, the output terminal 71 (first output terminal) that outputs a frequency signal from the first VCXO 7 is electrically connected to the output switching circuit 11 that is shared with the second VCXO 8, which will be described later. Although the attenuator illustrated in FIG. 1 is a so-called π-type unbalanced attenuator, as long as impedance matching and the output level are possible, the configuration of the attenuator is not limited thereto.

Such a first VCXO 7 performs signal amplification and waveform shaping such that the resonator X11 in the oscillation circuit continues the oscillation operation, while controlling the oscillation frequency of the resonator X11, depending on the control voltage applied from the outside. Thus, a first frequency signal of a desired frequency (first output frequency) is output from the first VCXO 7.

Meanwhile, the second VCXO 8 illustrated in FIG. 1 also includes an oscillation circuit having the same configuration as in the first VCXO 7.

Specifically, the second VCXO 8 first includes a resistor R21 (a second resistor), a variable-capacitance diode D21 (a second variable-capacitance diode), a capacitor C21, an expansion coil L21, and a resonator X21. The control voltage is input to one end of the resistor R21 from the outside. Further, the other end of resistor R21 is connected to the cathode side of the variable-capacitance diode D21 and one end of the capacitor C21. Further, the other end of the capacitor C21 is connected to one end of the expansion coil L21, and the other end of the expansion coil L21 is connected to one end of the resonator X21.

In addition, the second VCXO 8 further includes a transistor Q21, a resistor R22, a resistor R23, a resistor R24, a capacitor C22, a capacitor C23, a capacitor C24, and a coil L22. The base of the transistor Q21, one end of the resistor R22, and one end of the resistor R23 are connected to the other end of the resonator X21. These resistor R22 and resistor R23 function as a base bias resistor. Then, the other end of the resistor R23 is grounded. Further, the capacitor C22 and the capacitor C23 which have some of the load capacitance are inserted in a state of being connected in series, to between the base of the transistor Q21 and the ground. Then, the connection point between the capacitor C22 and the capacitor C23 and the emitter of the transistor Q21 are connected, and the resistor R24 is inserted as an emitter resistor between the emitter of the transistor Q21 and the ground. Further, the coil L22 and the capacitor C24 are connected in parallel between the collector of the transistor Q21 and the power switching circuit 10. A tuning circuit (multiplier circuit) 224 that can be tuned to the harmonic frequency (higher-order wave) of a desired order number of the resonator X21 is configured, and a C tap is configured.

In addition, the second VCXO 8 further includes a capacitor C25, a capacitor C26, a resistor R25, a resistor R26, and a resistor R27. The coil L22 and the capacitor C24 on the power switching circuit 10 side are respectively grounded through the capacitor C26. Meanwhile, one end of the capacitor C25 is connected to the collector side of the coil L22 and capacitor C24. The other end of the capacitor C25 is connected to the output switching circuit 11 through an attenuator constituted by the resistor R25, the resistor R26, and the resistor R27. In other words, the output terminal 81 (second output terminal) that outputs a frequency signal from the second VCXO 8 is electrically connected to the output switching circuit 11 that is shared with the first VCXO 7, which will be described later. Although the attenuator illustrated in FIG. 1 is a so-called π-type unbalanced attenuator, as long as impedance matching and the output level are possible, the configuration of the attenuator is not limited thereto.

Such a second VCXO 8 performs signal amplification and waveform shaping such that the resonator X21 in the oscillation circuit continues the oscillation operation, while controlling the oscillation frequency of the resonator X21, depending on the control voltage applied from the outside. Thus, a second frequency signal of a desired frequency (second output frequency) is output from the second VCXO 8.

Further, the first VCXO 7 and the second VCXO 8 are respectively provided with resonators having a fundamental frequency of, for example, 150 MHz band. Then, the resonator X11 provided in the first VCXO 7 and the resonator X21 provided in the second VCXO 8 have fundamental frequencies different from each other in the frequency band.

Then, the selection unit 9 operates the power switching circuit 10 and the output switching circuit 11, by a selection signal applied from the outside. This enables one of the first VCXO 7 and the second VCXO 8 to be selected and operated. For example, when the first VCXO 7 is selected by switching the conduction path of the power switching circuit 10 and the conduction path of the output switching circuit 11, the power supply voltage is applied only to the first VCXO 7, the output terminal 71 and the oscillator output terminal 63 are connected, and only a frequency signal is input from the first VCXO 7 to the amplifier 12, and is output as the first frequency signal after being amplified to a predetermined level. When the second VCXO 8 is selected by switching the power switching circuit 10 and the output switching circuit 11, the power supply voltage is applied only to the second VCXO 8, the output terminal 81 and the oscillator output terminal 63 are connected, and only a frequency signal is input from the second VCXO 8 to the amplifier 12, and is output as the second frequency signal after being amplified to a predetermined level.

Since the power switching circuit 10 is provided in this way and it is possible to apply a power supply voltage to one that corresponds to the output frequency of interest, among the first VCXO 7 and the second VCXO 8, power consumption is intended to be reduced and the occurrence of electromagnetic interference waves due to energization can be suppressed.

In the invention, the second output frequency of the second frequency signal output from the second VCXO 8 is higher than the first output frequency of the first frequency signal output from the first VCXO 7.

In addition, it is possible to match the frequency tuned by each tuning circuit to a desired value (for example, the fundamental frequency of the resonator, or its integer multiple), by appropriately setting the tuning circuits included in the first VCXO 7 and the second VCXO 8.

For example, when the fundamental frequency of the resonator X11 provided in the first VCXO 7 is 155 MHz, it is possible to output the frequency signal of 155 MHz as the first frequency signal or to output the frequency signal of 622 MHz or 778 MHz that is a fourth harmonic or a fifth harmonic of the fundamental frequency as the first frequency signal, by the setting of the tuning circuit.

For example, when the fundamental frequency of the resonator X21 provided in the second VCXO 8 is 161 MHz, it is possible to output the frequency signal of 161 MHz as the second frequency signal or to output the frequency signal of 644 MHz or 805 MHz that is a fourth harmonic or a fifth harmonic of the fundamental frequency as the second frequency signal, by the setting of the tuning circuit.

In general, the tuning frequency f of the tuning circuit is obtained by the inductance L of the coil and the capacitance C of the capacitor constituting a parallel resonance circuit as follows: $[f=1/\{2\pi(LC)^{1/2}\}]$. Therefore, the coil and capacitor of the tuning circuit (parallel resonance circuit) may be appropriately selected in order to match the frequency tuned in the tuning circuit to a desired value.

In addition, in the present embodiment, the amplifier 12 is inserted between the output switching circuit 11 and the oscillator output terminal 63. Therefore, the amplifier 12 is shared by the first VCXO 7 and the second VCXO 8. Therefore, as compared with the case where amplifiers are separately provided, it is possible to reduce the number of amplifiers 12, and the oscillator circuit 1 can be miniaturized. Such a configuration is particularly useful, for example, when the used frequencies are close to each other, as a clock signal used in a SONET/SDH network or the like.

Meanwhile, if the amplifier 12 is not shared by the first VCXO 7 and the second VCXO 8, the oscillator circuit 1 may include, for example, an amplifier for the first VCXO 7 and an amplifier for the second VCXO 8.

In addition, the first VCXO 7 and the second VCXO 8 each may include a filter that removes unwanted frequency components from the frequency signal which is output therefrom. Examples of such a filter include a surface acoustic wave (SAW) filter, and the like.

Further, the oscillator circuit 1 may include any discrete components, integrated circuit components and the like, in addition to the illustrated configuration.

The oscillator circuit 1 may further include one or more voltage-controlled oscillator circuits (VCXO) equivalent to the first VCXO 7 and the second VCXO 8. In other words, the oscillator circuit 1 may further include three or more VCXOs. In this case, the added VCXOs may be connected to the power switching circuit 10 and the output switching circuit 11.

Further, as the resonator X11 and the resonator X21, for example, various resonators such as an AT-cut quartz crystal resonator, a tuning fork type quartz crystal resonator, a surface acoustic wave resonator are used. The quartz crystal resonator is preferably used among them, from the viewpoint of obtaining a fundamental frequency with high frequency accuracy. Accordingly, an oscillator circuit 1 with high frequency accuracy is obtained.

2. Oscillator

The embodiment of the oscillator according to the invention will be described below.

Figure 2:
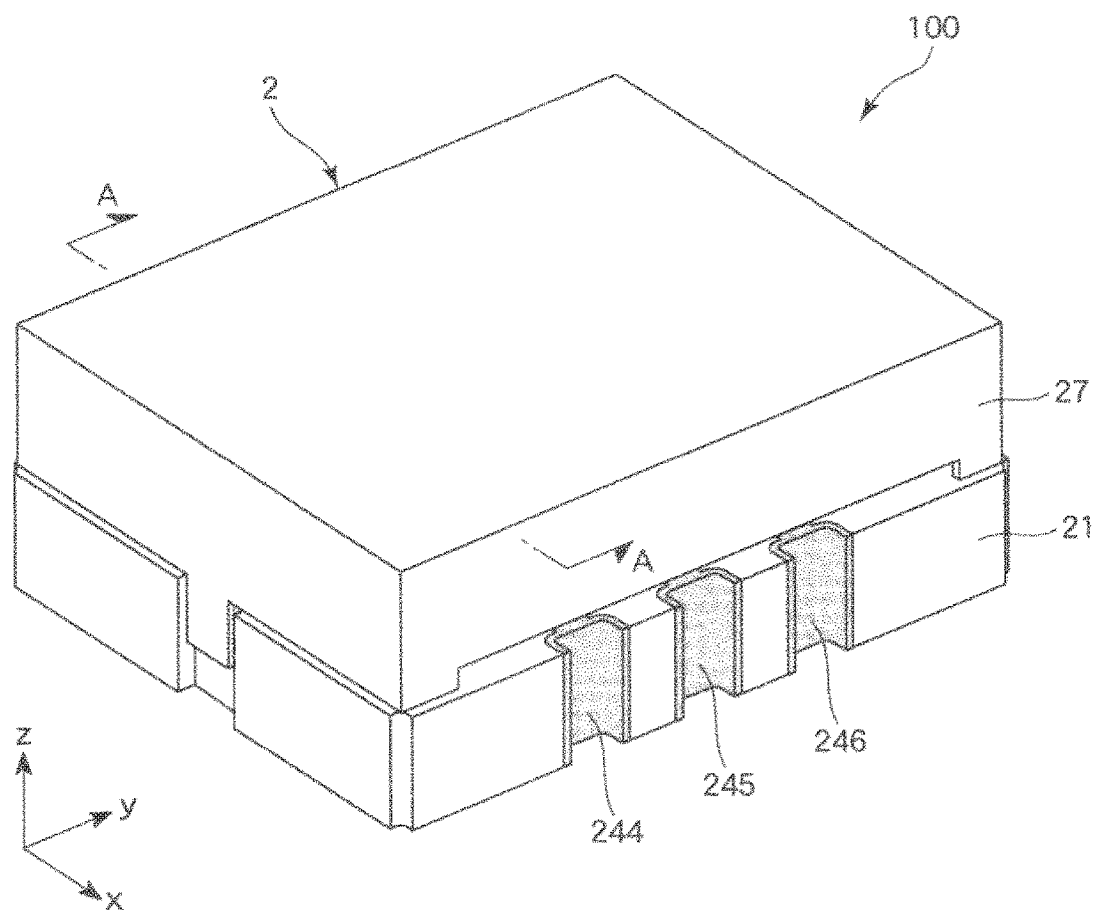
FIG. 2 is a perspective view illustrating an appearance of an oscillator (an embodiment of an oscillator according to the invention) including the oscillator circuit illustrated in FIG. 1.
Figure 3:
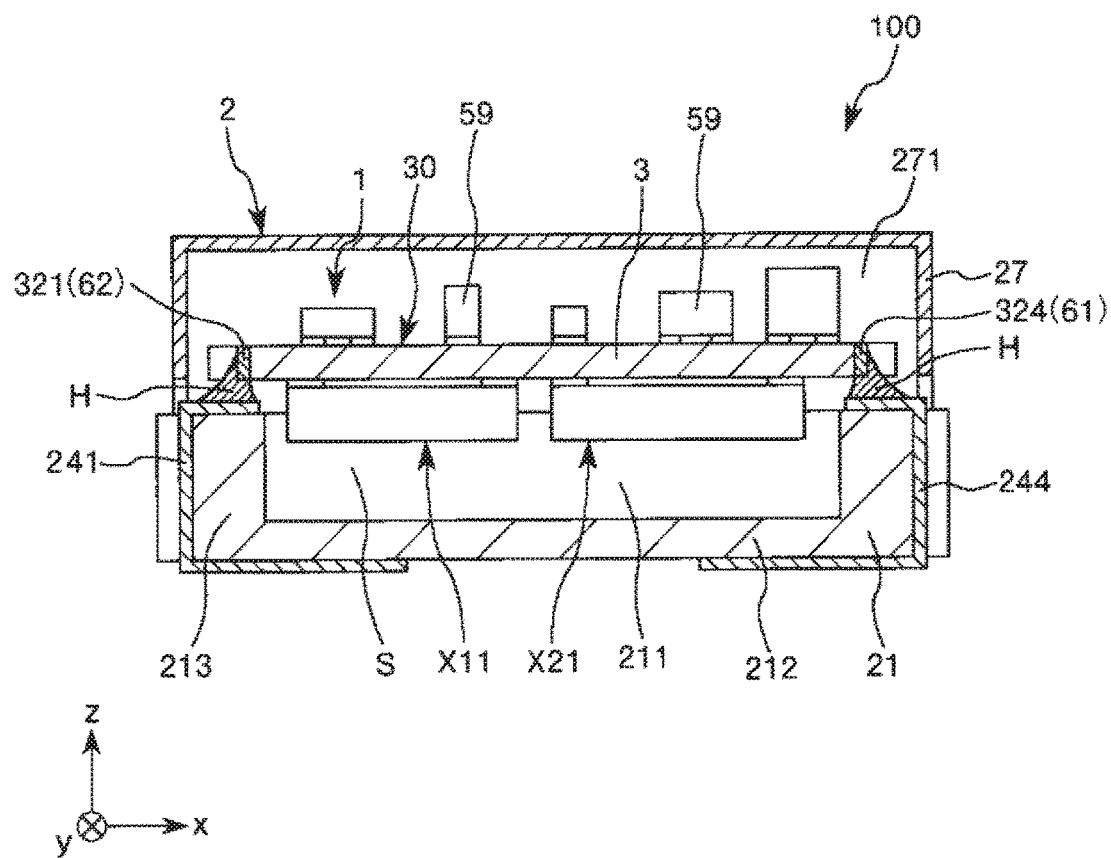
FIG. 3 is an A-A line longitudinal sectional view of the oscillator illustrated in FIG. 2.
Figure 4:
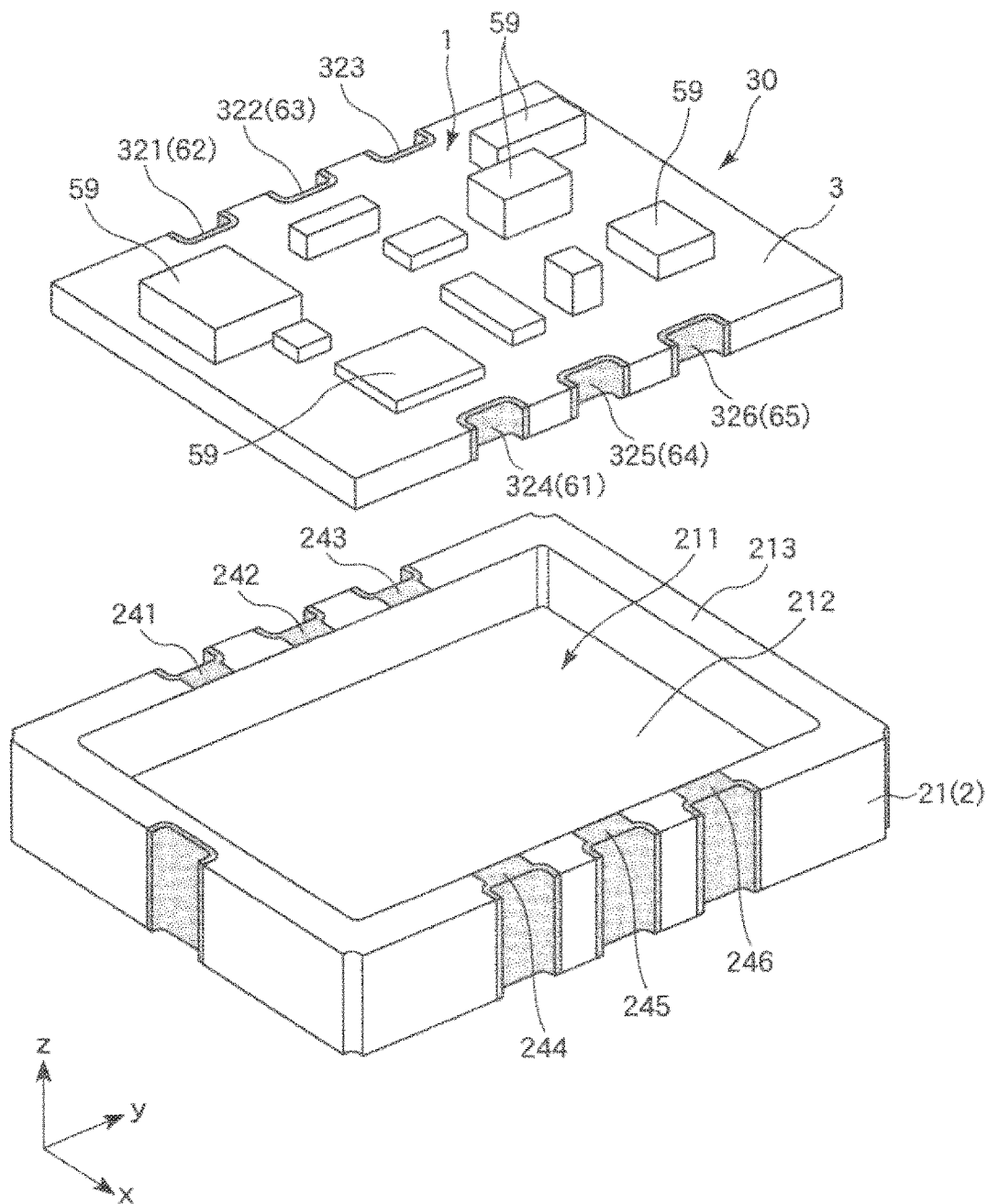
FIG. 4 is a partially exploded perspective view of the oscillator illustrated in FIG. 2.
Figure 5:
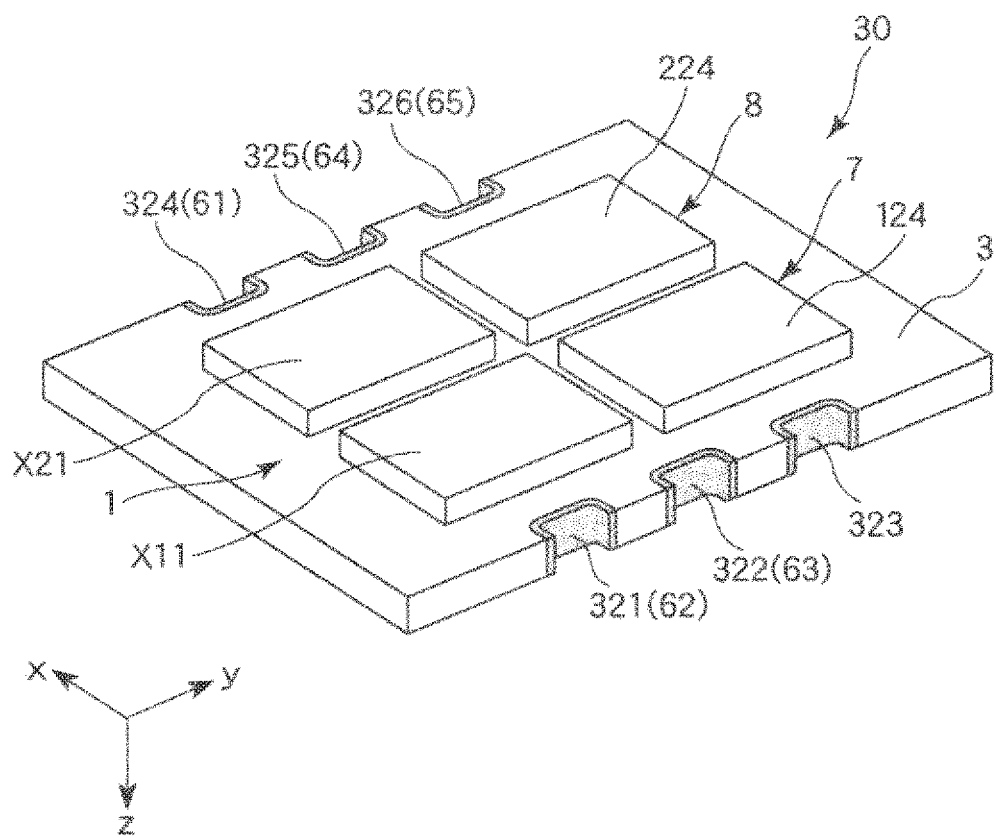
FIG. 5 is a partially exploded perspective view of the oscillator illustrated in FIG. 2.

FIG. 2 is a perspective view illustrating an appearance of an oscillator (an embodiment of an oscillator according to the invention) including the oscillator circuit illustrated in FIG. 1, FIG. 3 is an A-A line longitudinal sectional view of the oscillator illustrated in FIG. 2, FIG. 4 is a partially exploded perspective view of the oscillator illustrated in FIG. 2, FIG. 5 is a partially exploded perspective view of the oscillator illustrated in FIG. 2. For convenience of description, the lid provided in the oscillator is omitted in FIG. 4, and in FIG. 5, the oscillator circuit board provided in the oscillator is viewed from below.

The oscillator 100 illustrated in FIGS. 2 to 5 includes a package 2, a supporting substrate 3 fixed in the package 2, and a circuit board 30 including an oscillator circuit 1 mounted on the supporting substrate 3.

Among them, the package 2 includes a base substrate 21 provided with a recess 211, and a lid (cover) 27 which is provided with a recess 211 and bonded to the base substrate 21. In the package 2, an internal space S is provided between the base substrate 21 and the lid 27, and the circuit board 30 is accommodated in the internal space. Since the oscillator circuit 1 provided in the circuit board 30 is accommodated in such a package 2, it is possible to protect the oscillator circuit 1 from external force and environmental change, thereby allowing improvement in the reliability of the oscillator 100.

The base substrate 21, as illustrated in FIG. 3, has a box-shape including a recess 211, of which the top surface opens. In other words, the base substrate 21 includes a plate-shaped bottom plate 212, and a frame-shaped side wall 213 that is erected from the edge of the upper surface of the bottom plate 212.

Further, as illustrated in FIG. 4, six terminals 241, 242, 243, 244, 245, and 246 are provided in the base substrate 21, and these terminals 241 to 246 has both a function as an internal terminal to be electrically connected to the terminal provided in the circuit board 30, and a function as an external terminal to be electrically connected to the terminal provided in the mounting substrate (not shown) and the like on which the oscillator 100 is mounted.

In addition, the constituent material of the insulation portions of the package 2 is obtained, by performing a sintering process on ceramic green sheets made of, for example, aluminum oxide, aluminum nitride, silicon carbide, mullite, and glass-ceramic.

Meanwhile, the constituent material of the conductive portions of the package 2 is obtained by coating, for example, an underlying layer of tungsten (W), molybdenum (Mo), or the like with a plating layer of gold (Au), copper (Cu), or the like.

The circuit board 30 includes a supporting substrate (base member) 3 fixed in the package 2, and the oscillator circuit 1 mounted on the supporting substrate 3.

In the supporting substrate (substrate) 3, its overall shape is a flat plate shape, and is configured with, for example, a low-temperature co-fired ceramic substrate (LTCC substrate). As a result, a supporting substrate 3 of high strength can be obtained. Further, it is possible to form a wiring pattern at the same time, and reduce the manufacturing steps of the oscillator 100. In addition, the supporting substrate 3 may be a single-layer board or a multilayer board. Further, as the supporting substrate 3, without being limited to the low-temperature co-fired ceramic substrate, in addition thereto, for example, ceramic substrates other than the low-temperature co-fired ceramic substrate, resin substrates (printed circuit boards) made of a glass epoxy or other components, or glass substrates may be used.

Further, respective three notches (a total of six) are provided side by side on the two side surfaces extending in the y-axis direction of the supporting substrate 3, castellations having conductivity 321, 322, 323, 324, 325, and 326 are formed corresponding to these notches, among these, the castellations 321, 322, 324, 325, and 326 respectively constitute a power supply terminal 62, an oscillator output terminal (terminal for output) 63, a control voltage terminal 61, a selection signal terminal 64, and a ground terminal (terminal for ground) 65, which are included in the oscillator circuit 1.

As illustrated in FIG. 3, the supporting substrate 3 is arranged to overlap the recess 211 in a plan view, the castellations 321, 322, 323, 324, 325, and 326 and the terminals 241, 242, 243, 244, 245, and 246 are joined through solder H, and thus the supporting substrate 3 is fixed to the upper surface of the base substrate 21, and the castellations 321, 322, 323, 324, 325, and 326 and the terminals 241, 242, 243, 244, 245, and 246 are electrically connected to each other. Further, a fixing member for fixing the supporting substrate 3 to the base substrate 21 is not limited to the solder, and it is possible to use a metal brazing material such as gold braze or silver braze, a conductive adhesive, or the like.

The oscillator circuit 1 of which configuration has been previously described with reference to FIG. 1 includes in the oscillator 100, as illustrated in FIGS. 3 to 5, wiring patterns (not shown) formed on the upper surface, a lower surface, and the interior of the supporting substrate 3, resonators X11, X21 and tuning circuits (multiplier circuit) 124, 224 which are mounted on the lower surface of the supporting substrate 3, a plurality of circuit elements 59 mounted on the upper surface of the supporting substrate 3, and castellations 321, 322, 324, 325, 326 respectively constituting the power supply terminal 62, the oscillator output terminal (terminal for output) 63, the control voltage terminal 61, the selection signal terminal 64, the ground terminal 65 (terminal for the ground) formed on the side surface of the supporting substrate 3.

In addition, except for the resonators X11, X21, the tuning circuits 124, 224, the power supply terminal 62, the oscillator output terminal 63, the control voltage terminal 61, the selection signal terminal 64, and the ground terminal 65, respective components constituting the oscillator circuit 1 are mounted as a plurality of circuit elements 59.

In addition, the resonators X11, X21, the tuning circuits 124, 224, the power supply terminal 62, the oscillator output terminal 63, the control voltage terminal 61, the selection signal terminal 64, the ground terminal 65, and the circuit elements 59 are electrically connected with each other through wiring patterns, thereby the oscillator circuit 1 is formed.

As illustrated in FIG. 5, in the oscillator circuit 1 having such a configuration, in the supporting substrate 3, the power supply terminal 62 and the oscillator output terminal 63 are provided side by side in the y-axis direction, on the side surface on −x-axis direction side extending along the y-axis direction, and the control voltage terminal 61, the selection signal terminal 64, and the ground terminal 65 are provided side by side in the y-axis direction, on the side surface on +x-axis direction side extending along the y-axis direction.

Further, the resonator X11 and the tuning circuit 124 are arranged on the lower surface of the supporting substrate 3, side by side in this order in the +y-axis direction, and mounted on the −x-axis direction side, and the resonator X21 and the tuning circuit 224 are arranged on the lower surface of the supporting substrate 3, side by side in this order in the +y-axis direction, and mounted on the +x-axis direction side, such that the first VCXO 7 is located on the −x-axis direction side of the lower surface of the supporting substrate 3, and the second VCXO 8 is located on the +x-axis direction side of the lower surface of the substrate 3.

Here, as described above, although the second output frequency of the second frequency signal output from the second VCXO 8 is higher than the first output frequency of the first frequency signal output from the first VCXO 7, respective components constituting the oscillator circuit 1 in the supporting substrate 3 have the positional relationship as described above, such that the second VCXO 8 outputting the second output frequency is located closer to the ground terminal 65 than the first VCXO 7 outputting the first output frequency.

It has been found through the study by the inventors of the invention that if the positional relationship between the second VCXO 8 and the first VCXO 7 satisfies the positional relationship as described above, the second output frequency (higher than the first output frequency) that is output from the second oscillator circuit is stabilized.

Therefore, since the oscillator is designed to satisfy such a relationship, even if there is a limit to a degree of freedom of design of the oscillator 100, it is possible to stabilize both the first output frequency and the second output frequency which are output from the first VCXO 7 and the second VCXO 8.

Further, in the present embodiment, as illustrated in FIG. 5, among respective components constituting the second VCXO 8 and the first VCXO 7, the tuning circuit 124 and the tuning circuit 224 are mounted closer to the ground terminal 65, and among these, the tuning circuit 224 is disposed closer to the ground terminal 65 than the tuning circuit 124. Thus, it is possible to more reliably stabilize the second output frequency that the second VCXO 8 outputs.

Further, as illustrated in FIG. 5, since the first VCXO 7 is located on the −x-axis direction side of the lower surface of the supporting substrate 3, the second VCXO 8 is located on the +x-axis direction side of the lower surface of the supporting substrate 3, the ground terminal 65 is provided on the side surface on +x-axis direction side extending along the y-axis direction, and the oscillator output terminal 63 is provided on the side surface on −x-axis direction side extending along the y-axis direction, the first of VCXO 7 and the second VCXO 8 are arranged at a position between the ground terminal 65 and the oscillator output terminal 63. By such a configuration, it is possible to reliably stabilize the second output frequency that the second VCXO 8 outputs.

Although the second output frequency that is output from the second VCXO 8 may be higher than the first output frequency that the first VCXO 7 outputs, specifically, is preferably not less than 800 MHz. When the second output frequency is such a high frequency, it is possible to stabilize the second output frequency more reliably by arranging the second VCXO 8 closer to the ground terminal 65.

Then, another configuration example of an embodiment of the oscillator according to the invention will be described.

Figure 6:
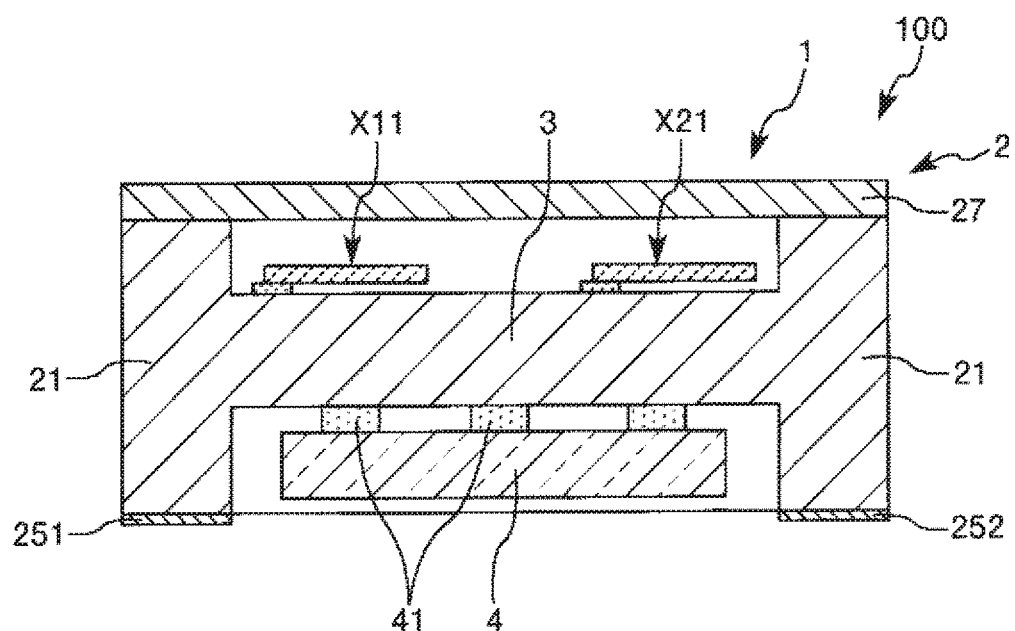
FIG. 6 is a longitudinal sectional view illustrating another configuration example of the embodiment of the oscillator according to the invention.

FIG. 6 is a longitudinal sectional view illustrating another configuration example of the embodiment of the oscillator according to the invention.

The oscillator 100 illustrated in FIG. 6 includes a package 2, a supporting substrate 3 fixed in the package 2, and an oscillator circuit 1 mounted on the supporting substrate 3. In the following description, the upper part in FIG. 6 is referred to as "up", and the lower part thereof is referred to as "down".

In the oscillator 100 illustrated in FIG. 6, the resonator X11 included in the first VCXO 7 and the resonator X21 included in the second VCXO 8 are mounted on the upper surface of the supporting substrate 3 in the oscillator circuit 1. Meanwhile, at least a portion of the resistor, the variable-capacitance diode, the capacitor, and the transistor constituting respective components including the tuning circuit 124, except for the resonator X11, which are included in the first VCXO 7 and the resistor, the variable-capacitance diode, the capacitor, and the transistor constituting respective components including the tuning circuit 224, except for the resonator X21, which are included in the second VCXO 8 in the oscillator circuit 1 are integrated into an integrated circuit element 4, and the integrated circuit element 4 is mounted on the lower surface of the supporting substrate 3 through a plurality of terminals 41 included in the integrated circuit element 4. In the oscillator 100 illustrated in FIG. 6 of the above configuration, in the integrated circuit element 4, a plurality of terminals 41 constitute the power supply terminal 62, the oscillator output terminal 63, the control voltage terminal 61, the selection signal terminals 64, and the ground terminals 65, the tuning circuit 224 is located closer to the ground terminal 65 among these as compared with the tuning circuit 124, and thus the second output frequency that is output from the second VCXO 8 is stabilized.

Further, external connection terminals 251 and 252 are provided on the lower surface of the package 2.

According to the oscillator 100, it is possible to reduce the number of discrete components constituting the oscillator circuit 1, such that miniaturization is achieved and manufacturability is improved.

3. Electronic Apparatus

Next, electronic apparatuses having the oscillator according to the invention (the electronic apparatus according to the invention) will be described in detail, based on FIG. 7 to FIG. 10.

Figure 7:
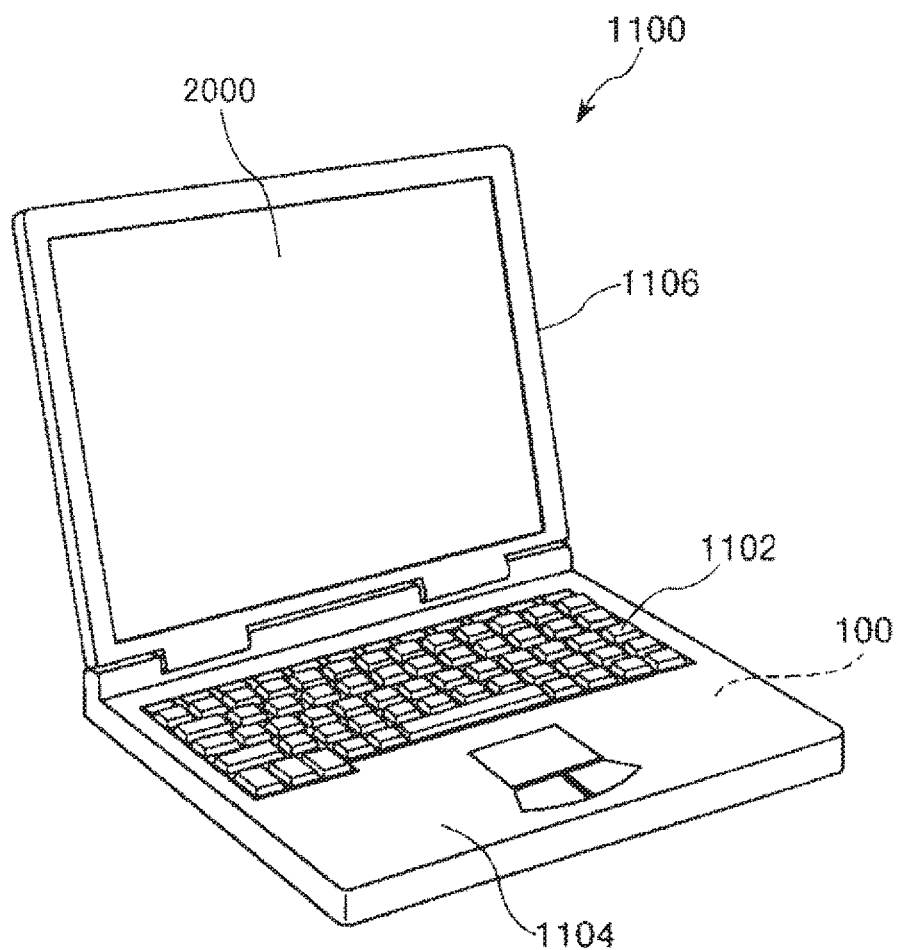
FIG. 7 is a perspective view illustrating a configuration of a mobile type (or a notebook type) personal computer which is a first example of an electronic apparatus according to the invention.

FIG. 7 is a perspective view illustrating a configuration of a mobile type (or a notebook type) personal computer which is a first example of the electronic apparatus according to the invention. In this FIG. 7, a personal computer 1100 includes a main body 1104 having a keyboard 1102, and a display unit 1106 having a display 2000. The display unit 1106 is rotatably supported with respect to the main body 1104 through a hinge structure. Such a personal computer 1100 includes the built-in oscillator 100.

Figure 8:
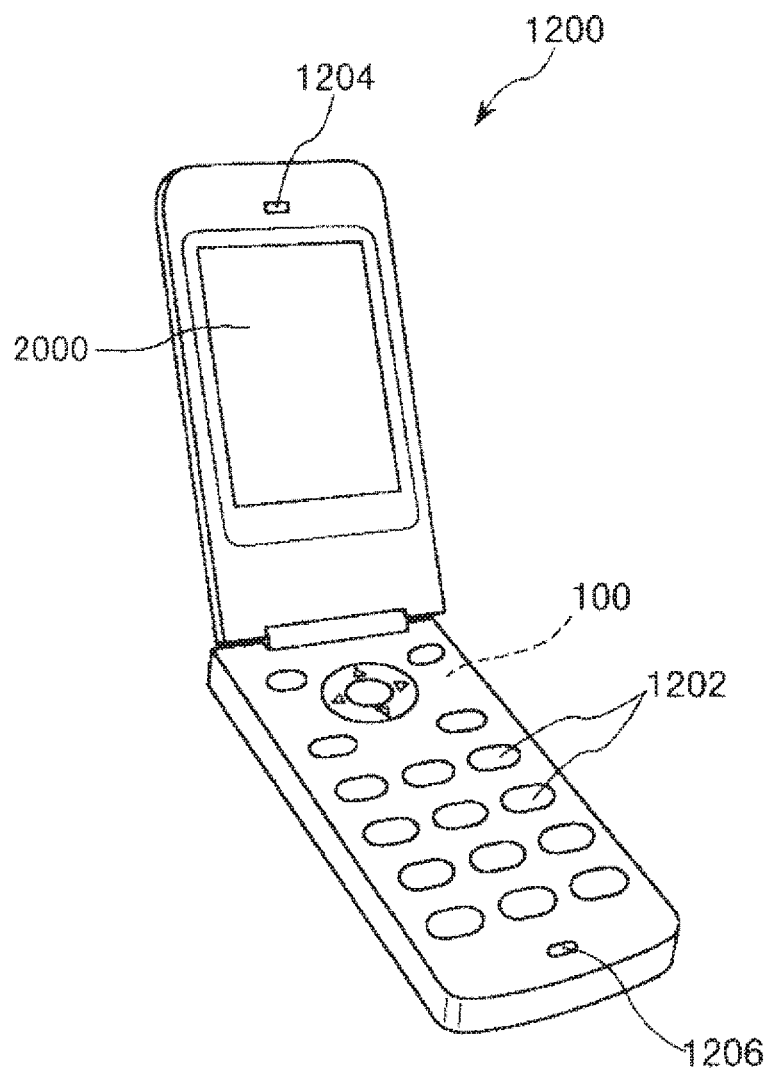
FIG. 8 is a perspective view illustrating a configuration of a mobile phone (including a PHS) which is a second example of the electronic device according to the invention.

FIG. 8 is a perspective view illustrating a configuration of a mobile phone (including a PHS) which is a second example of the electronic device according to the invention. In this FIG. 8, a mobile phone 1200 includes a plurality of operation buttons 1202, an earpiece 1204, and a mouthpiece 1206, and a display portion 2000 is disposed between the operation buttons 1202 and the earpiece 1204. Such a mobile phone 1200 includes the built-in oscillator 100.

Figure 9:
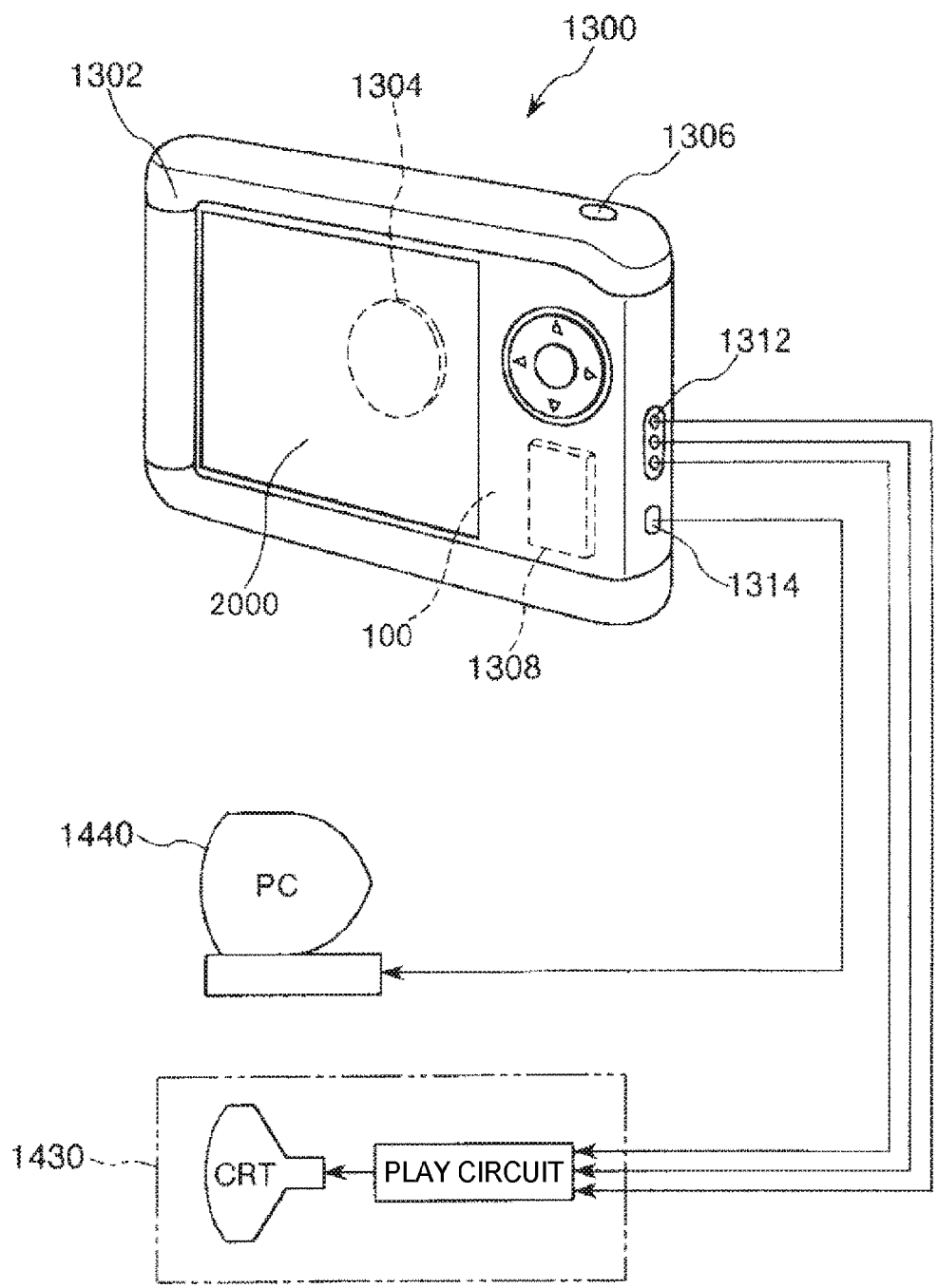
FIG. 9 is a perspective view illustrating a configuration of a digital still camera which is a third example of the electronic device according to the invention.

FIG. 9 is a perspective view illustrating a configuration of a digital still camera which is a third example of the electronic device according to the invention. In addition, in this FIG. 9, the connection with an external device is illustrated in a simplified manner. Whereas in a general camera, a silver salt film is exposed to the optical image of an object, a digital still camera 1300 photoelectrically converts an optical image of an object by an image pickup device such as a charge coupled device (CCD) and generates an imaging signal (video signal).

A display unit 2000 is provided on the back surface of the case (body) 1302 which the digital still camera 1300 has therein, and is configured to perform display based on the imaging signal by the CCD, and the display unit 2000 functions as a viewfinder that displays the object as an electronic image. Further, a light receiving unit 1304 including an optical lens (an imaging optical system) and a CCD are provided on the front surface of the case 1302 (the back side in FIG. 9).

If a photographer confirms an object image displayed on the display 2000, and presses a shutter button 1306, the imaging signal of the CCD at that time is transferred to and stored in the memory 1308. Further, in the digital still camera 1300, a video signal output terminal 1312 and an input output terminal 1314 for data communication are provided in the side surface of the case 1302. As illustrated in FIG. 9, a TV monitor 1430 and a personal computer 1440 are respectively connected as required to the video signal output terminal 1312 and the input output terminal 1314 for data communication. Further, it is configured that the imaging signal stored in the memory 1308 is output to the television monitor 1430 or the personal computer 1440 by a predetermined operation. Such a digital still camera 1300 includes the built-in oscillator 100.

Figure 10:
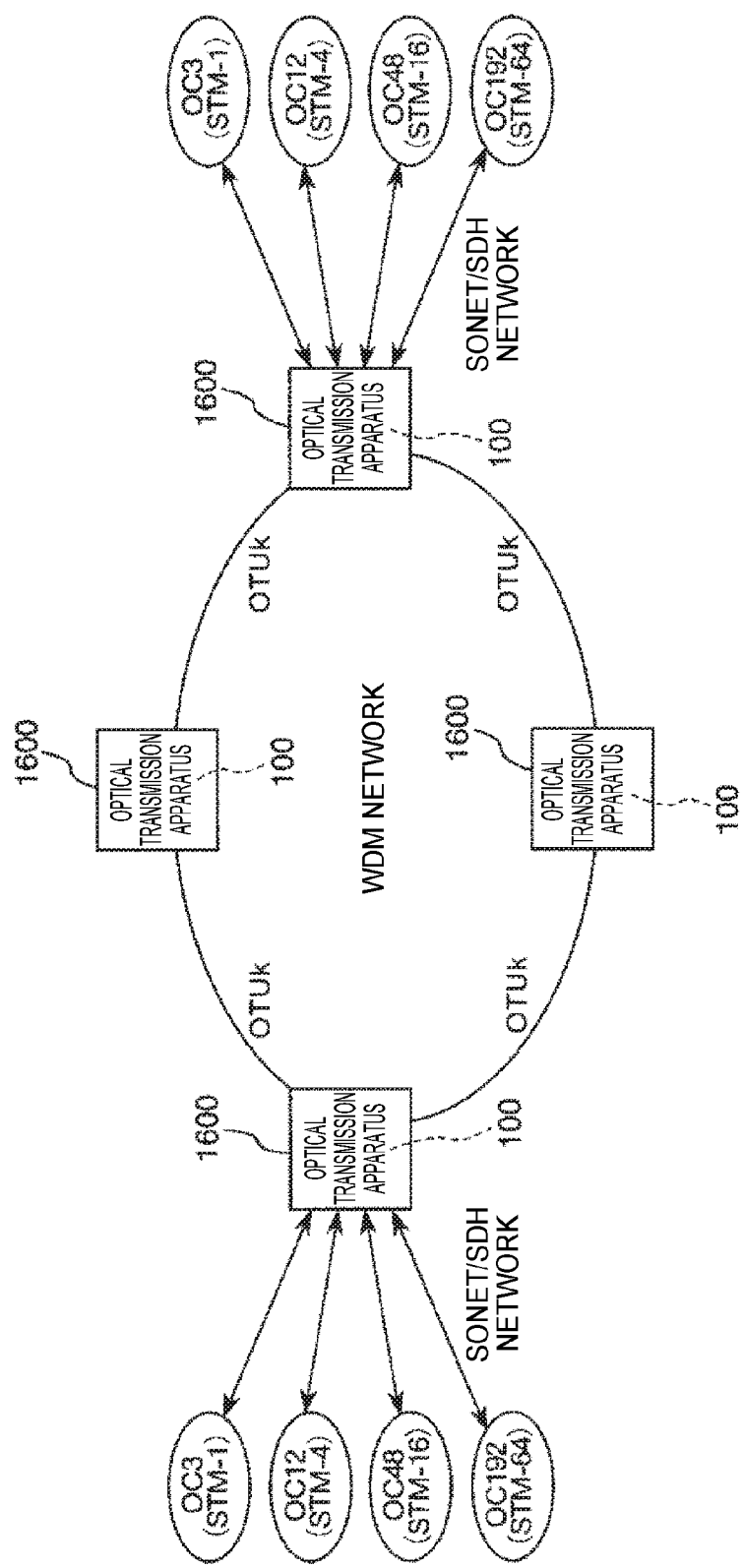
FIG. 10 is a schematic diagram of a network including an optical transmission apparatus according to a fourth example of the electronic apparatus according to the invention.

FIG. 10 is a schematic diagram of a network including an optical transmission apparatus according to a fourth example of the electronic apparatus according to the invention. In this FIG. 10, an optical transmission apparatus 1600 is arranged at a boundary between a SONET/SDH network and a wavelength division multiplexing (WDM) network, and converts a client signal transmitted to the SONET/SDH network and an OTUk (k=2, 3) signal transmitted through the WDM network to each other. In the example of FIG. 10, examples of the client signal include an OC3/STM-1 signal, an OC12/STM-4 signal, an OC48/STM-16 signal, and an OC192/STM-64 signal.

Such an optical transmission apparatus 1600 includes a clock generator that generates a clock corresponding to the client signal, and the oscillator 100 is built into the clock generator. The clock generating unit is adapted to output clocks having different frequencies depending on client signals having different transmission bit rates. In such a case, it is possible to easily output clocks of different frequencies by providing the two-frequency switching type oscillator 100.

Further, in addition to the personal computer (mobile personal computer) in FIG. 7, the mobile phone in FIG. 8, the digital still camera in FIG. 9, and the optical transmission apparatus in FIG. 10, the electronic apparatus including the oscillator according to the invention is applicable to ink-jet type discharge devices (for example, ink jet printers), laptop personal computers, TVs, video cameras, video recorders, car navigation devices, pagers, electronic notebooks (having communication functions), electronic dictionaries, calculators, electronic game machines, word processors, workstations, TV phones, security television monitors, electronic binoculars, POS terminals, medical equipment (for example, electronic thermometers, blood pressure meters, blood glucose meters, electrocardiogram measurement apparatuses, ultrasonic diagnostic equipment, electronic endoscopes), fish finders, various types of measurement equipment, instruments (for example, vehicles, aircrafts, ship gauges), flight simulators or the like.

4. Moving Object

Figure 11:
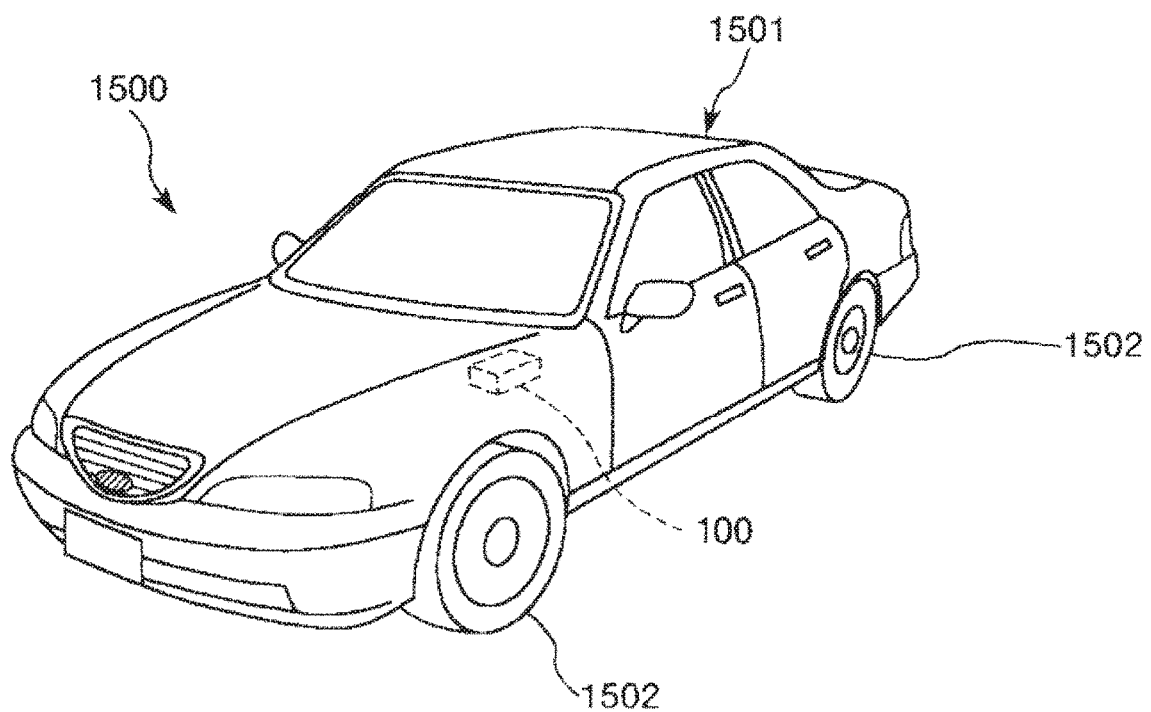
FIG. 11 is a perspective view illustrating a configuration of a vehicle which is an example of a moving object according to the invention.

FIG. 11 is a perspective view illustrating a configuration of a vehicle which is an example of a moving object according to the invention.

In FIG. 11, a moving object 1500 includes a body 1501, and four wheels 1502, and is configured to rotate the wheels 1502 through a power source (an engine) provided in the vehicle body 1501. Such a moving object 1500 includes the built-in oscillator 100.

In addition, the moving object according to the invention is not limited to a vehicle, and is applicable to, for example, various moving objects such as aircrafts, ships, and motorcycles.

Hitherto, the oscillator, the electronic apparatus, and the moving object according to the invention have been described based on the respective embodiments, but the invention is not limited thereto, and the configuration of each part can be replaced with any configuration having a similar function. Further, other arbitrary components may be added.

The entire disclosure of Japanese Patent Application No. 2014-194171, filed Sep. 24, 2014 is expressly incorporated by reference herein.

What is claimed is:

1. An oscillator comprising:
a support substrate;
at least one transducer mounted on a first surface of the support substrate;
a single integrated circuit element mounted on a second surface of the support substrate, the single integrated circuit element including
  a first tuning circuit integrated therein, forming only part of the single integrated circuit element, and generating a first output frequency,
  a second tuning circuit integrated therein, forming only part of the single integrated circuit element, and generating a second output frequency that is higher than the first output frequency, and
  a ground terminal integrated therein,
wherein the single integrated circuit is mounted on the second surface through the ground terminal, and
wherein the second tuning circuit is closer than the first tuning circuit to the ground terminal.

2. The oscillator according to claim 1,
wherein the first and second frequency generating components comprise first and second oscillator circuits respectively.

3. The oscillator according to claim 1, wherein:
the at least one transducer includes a first transducer and a second transducer,
the first frequency generating component is a first oscillator circuit that is electrically connected to the first transducer, and
the second frequency generating component is a second oscillator circuit that is electrically connected to the second transducer.

4. The oscillator according to claim 1,
wherein the ground terminal connects the integrated circuit element to the second surface of the support substrate.

5. The oscillator according to claim 1,
wherein the at least one transducer and the integrated circuit element overlap at least partially in plan view.

6. The oscillator according to claim 3,
wherein the first transducer and the second transducer at least partially overlap the integrated circuit element in plan view.

7. The oscillator according to claim 1,
wherein the second output frequency is 800 MHz or more.

8. The oscillator according to claim 1, further comprising:
a terminal for outputting anyone of the first output frequency and the second output frequency, and
wherein the first and second frequency generating components are placed at a position between the ground terminal and the output terminal on the substrate in plan view.

9. An electronic apparatus comprising:
the oscillator according to claim 1.

10. An electronic apparatus comprising:
the oscillator according to claim 2.

11. An electronic apparatus comprising:
the oscillator according to claim 3.

12. An electronic apparatus comprising:
the oscillator according to claim 5.

13. A moving object comprising:
the oscillator according to claim 1.

14. A moving object comprising:
the oscillator according to claim 2.

15. A moving object comprising:
the oscillator according to claim 3.

16. A moving object comprising:
the oscillator according to claim 5.

* * * * *